(12) United States Patent
Rice et al.

(10) Patent No.: US 7,597,183 B2
(45) Date of Patent: Oct. 6, 2009

(54) KINEMATIC PIN WITH SHEAR MEMBER AND SUBSTRATE CARRIER FOR USE THEREWITH

(75) Inventors: Michael R. Rice, Pleasanton, CA (US); Eric A. Englhardt, Palo Alto, CA (US); Robert B. Lowrance, Los Gatos, CA (US); Martin R. Elliott, Round Rock, TX (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/932,224

(22) Filed: Oct. 31, 2007

(65) Prior Publication Data

US 2008/0051925 A1 Feb. 28, 2008

Related U.S. Application Data

(62) Division of application No. 10/988,175, filed on Nov. 12, 2004.

(60) Provisional application No. 60/520,054, filed on Nov. 13, 2003.

(51) Int. Cl.
*B65G 15/64* (2006.01)

(52) U.S. Cl. .................... 198/345.1; 414/940; 414/941; 198/345.2

(58) Field of Classification Search ............... 248/677, 248/346.05, 188.8, 188.9, 188.2, 188, 346.01; 198/345.1, 345.2, 345.3; 294/902; 414/941, 414/940

See application file for complete search history.

(56) References Cited

U.S. PATENT DOCUMENTS

| 1,937,438 A | 11/1933 | Schacht |
| 2,458,621 A | 1/1949 | Miller |
| 3,601,345 A * | 8/1971 | Johnson ..................... 248/615 |
| 3,868,079 A | 2/1975 | Johnson |
| 5,007,607 A | 4/1991 | Kim |
| 5,088,669 A | 2/1992 | Zinnbauer |

(Continued)

FOREIGN PATENT DOCUMENTS

EP 0219826 B1 9/1994

(Continued)

OTHER PUBLICATIONS

No-Author, "Disco Corp. Releases Extremely Space Efficient 8in Wafer Grinder. Annotated Title-Disco introduces fully automated grinder for 8in wafers, the "DFG840", which takes u p 2/3 space of previous model; to expand sales through marketing in SE Asia", Sep. 14, 1994, Nikkan Kogyo Shimbun, Jpanese Language, p. 9. (Abstract Only).

(Continued)

*Primary Examiner*—A. Joseph Wujciak, III
(74) *Attorney, Agent, or Firm*—Dugan & Dugan

(57) ABSTRACT

A kinematic pin and a substrate carrier adapted to deter dislodgment of the substrate carrier from the kinematic pin are provided. A shear member on the kinematic pin interacts with a shear feature of the substrate carrier to deter lateral movement of the substrate carrier relative to the kinematic pin. A substrate carrier handler that employs the kinematic pin is also provided.

20 Claims, 6 Drawing Sheets

U.S. PATENT DOCUMENTS

| | | | |
|---|---|---|---|
| 5,092,557 A | 3/1992 | Sawatzki | |
| 5,169,115 A | 12/1992 | Hsiang | |
| 5,170,972 A | 12/1992 | Guell | |
| 5,980,183 A | 11/1999 | Fosnight | |
| 6,137,530 A | 10/2000 | Brown | |
| 6,165,268 A | 12/2000 | Ow et al. | |
| 6,307,211 B1 | 10/2001 | Beckhart et al. | |
| 6,364,331 B1 | 4/2002 | Yap | |
| 6,389,706 B1 | 5/2002 | Kuebart et al. | |
| 6,419,438 B1 | 7/2002 | Rosenquist | |
| 6,579,052 B1 | 6/2003 | Bonora et al. | |
| 6,915,993 B2 | 7/2005 | O'Leary | |
| 7,230,702 B2* | 6/2007 | Rice et al. | 356/400 |
| 7,234,584 B2* | 6/2007 | Rice et al. | 198/465.1 |
| 2003/0110649 A1* | 6/2003 | Hudgens et al. | 33/286 |
| 2005/0135903 A1* | 6/2005 | Rice et al. | 414/217 |
| 2005/0167554 A1 | 8/2005 | Rice et al. | |
| 2005/0273190 A1* | 12/2005 | Duffin et al. | 700/112 |
| 2007/0059145 A1* | 3/2007 | Rice et al. | 414/626 |
| 2007/0235287 A1* | 10/2007 | Rice et al. | 198/419.3 |
| 2008/0050217 A1* | 2/2008 | Rice et al. | 414/800 |
| 2008/0187419 A1* | 8/2008 | Rice et al. | 414/222.02 |
| 2008/0286076 A1* | 11/2008 | Elliott et al. | 414/222.01 |
| 2008/0289932 A1* | 11/2008 | Rice et al. | 198/465.1 |
| 2009/0030547 A1* | 1/2009 | Rice et al. | 700/218 |

FOREIGN PATENT DOCUMENTS

| | | |
|---|---|---|
| EP | 0472536 B1 | 12/1994 |
| EP | 0684631 B1 | 4/1998 |
| JP | 08139153 A | 5/1996 |
| WO | WO 87/06561 A1 | 11/1987 |
| WO | WO 97/03001 A1 | 1/1997 |
| WO | WO 00/03416 A2 | 1/2000 |
| WO | WO 00/03416 A3 | 1/2000 |
| WO | WO 00/59004 A1 | 10/2000 |
| WO | WO 00/67334 A1 | 11/2000 |
| WO | WO 01/10756 A1 | 2/2001 |

OTHER PUBLICATIONS

Martin, et al., "Design Criteria for 300 mm Silicon Wafer Carriers, Material Handling Systems & Tools", 1995, Proceedings of the 41st Annual Technical Meeting of the Institute of Environmental Sciences, pp. 107-117.

Weiss, Mitchell, "Evaluating 300-mm Fab Automation Technology Options and Selection Criteria", Jun. 1997, Micro, vol. 15, No. 6, pp. 65-66, 68, 70, 72, 74, 76, 78-79.

No-Author, "Equipe Helps Streamline 300 mm Water Processing", Dec. 1, 1997, Manufacturing Automation, vol. 7, No. 3, p. 1-5.

No-Author, "300mm Single-Wafer Handling" (Brief Article), Apr. 1, 2000, Solid State Technology, vol. 43, No. 4, p. 99.

No-Author, "Entegris Ships Record Nummber of 300mm FOUPs", Mar. 19, 2001, Business Wire, p. 2810.

\* cited by examiner

KINEMATIC PIN WITH SHEAR MEMBER AND SUBSTRATE CARRIER FOR USE THEREWITH

This application is a division of and claims priority to U.S. patent application Ser. No. 10/988,175, filed Nov. 12, 2004, which claims priority to U.S. Provisional Patent Application Ser. No. 60/520,054, filed Nov. 13, 2003, each of which is hereby incorporated by reference herein in its entirety for all purposes.

CROSS REFERENCE TO RELATED APPLICATIONS

The present application is related to the following commonly-assigned, co-pending U.S. Patent Applications, each of which is hereby incorporated herein by reference in its entirety for all purposes:

U.S. patent application Ser. No. 10/650,310, filed Aug. 28, 2003 and titled "System For Transporting Substrate Carriers", now U.S. Pat. No. 7,234,584;

U.S. patent application Ser. No. 10/650,480, filed Aug. 28, 2003 and titled "Substrate Carrier Handler That Unloads Substrate Carriers Directly From a Moving Conveyor", now U.S. Pat. No. 7,243,003;

U.S. patent application Ser. No. 10/764,982, filed Jan. 26, 2004 and titled "Methods and Apparatus for Transporting Substrate Carriers", now U.S. Pat. No. 7,077,264; and U.S. patent application Ser. No. 10/764,820, filed Jan. 26, 2004, and titled "Overhead Transfer Flange and Support for Suspending Substrate Carrier".

FIELD OF THE INVENTION

The present invention relates generally to the field of semiconductor substrate carriers, and more specifically to methods and apparatuses for aligning a substrate carrier on a surface and preventing lateral motion of the substrate carrier despite acceleration thereof.

BACKGROUND OF THE INVENTION

In the process of producing semiconductor devices, silicon substrates are commonly stored in substrate carriers. In turn, substrate carriers are commonly supported by substrate carrier support surfaces having kinematic pins attached thereto designed to interact with mating features of the substrate carrier. As long as the substrate carrier is placed on the support surface so that the mating features of the substrate carrier are roughly aligned, but not necessarily precisely aligned with the kinematic pins (i.e., within the "capture window" as defined by the geometry of the kinematic pins and/or the mating features of the substrate carrier), the force of gravity will generally be sufficient to enable the substrate carrier to settle into precise alignment with the kinematic pins of the support surface.

SUMMARY OF THE INVENTION

The present invention provides a kinematic pin for supporting a substrate carrier. The inventive kinematic pin comprises a pin body having an inclined surface adapted to slidably communicate with an inclined surface of a mating feature of a substrate carrier, and adapted to allow the mating feature to locate on and laterally align with the kinematic pin via the force of gravity. The pin body further has a shear, i.e, a member adapted to deter a lateral inertial load (e.g., arising from the substrate carrier) from urging the mating feature into misalignment with the kinematic pin.

The invention further provides an inventive substrate carrier comprising a substrate carrier body adapted to support a substrate and having a bottom surface. One or more features are located on the bottom surface of the substrate carrier body and are adapted to interface with a kinematic pin so as to align the substrate carrier on the kinematic pin. A shear member interface is located within the one or more features on the bottom surface of the substrate carrier. The shear member interface has generally vertical sides and is adapted to interface with a shear member of a kinematic pin, so as to deter lateral motion of the substrate carrier relative to the kinematic pin.

An inventive method of deterring lateral movement of a substrate carrier comprises providing a kinematic pin for supporting a substrate carrier, the kinematic pin having an inclined surface and a shear member extending from the inclined surface; placing a substrate carrier having a feature adapted to mate with the kinematic pin, in contact with the kinematic pin such that the kinematic pin contacts the substrate carrier's mating feature; aligning the substrate carrier on the kinematic pin via the inclined surface; and deterring lateral movement of the aligned substrate carrier via the shear member.

An inventive substrate carrier handler is also provided. The inventive substrate carrier handler comprises a surface for supporting a substrate carrier, and one or more kinematic pins located on the surface for supporting a substrate carrier. Each kinematic pin has an inclined surface for aligning the substrate carrier and a shear member located on the inclined surface for deterring lateral movement of the substrate carrier relative to the one or more kinematic pins. A controller is adapted to cause the substrate carrier handler to accelerate the surface for supporting a substrate carrier, so as to generate a lateral inertial load between the one or more kinematic pins, and a substrate carrier supported thereon.

Once a substrate carrier is precisely aligned on the kinematic pins, lateral forces and twisting forces, if present with sufficient magnitude, may tend to dislodge the substrate carrier from the kinematic pins, potentially causing damage to the substrate, substrate carrier, or other equipment. The inventive kinematic pins, substrate carriers, and kinematic pin/ substrate carrier handler systems are adapted to deter such dislodgment and thus are advantageously employed when significant substrate carrier accelerations are required.

Other features and aspects of the present invention will become more fully apparent from the following detailed description of the preferred embodiments, the appended claims and the accompanying drawings.

DETAILED DESCRIPTION

In accordance with the present invention, an inventive kinematic pin, an inventive substrate carrier, and an inventive kinematic pin/substrate carrier system are provided which are adapted to deter dislodgment of a substrate carrier from a kinematic pin on which it sits, particularly when such dislodgment is caused by generally horizontally-oriented forces. Specifically, a novel shear member on the kinematic pin interacts with a novel feature of the substrate carrier to deter lateral movement of the substrate carrier relative to the kinematic pin. The system, which is described below with reference to FIGS. 1-6, is especially effective in opposing lateral inertial forces generated when an end effector slows down or speeds up a substrate carrier. The substrate carrier may include a substrate carrier adapted to transport only one substrate (e.g., a single substrate carrier) or multiple substrates (e.g., a multiple substrate carrier).

Figure 1:
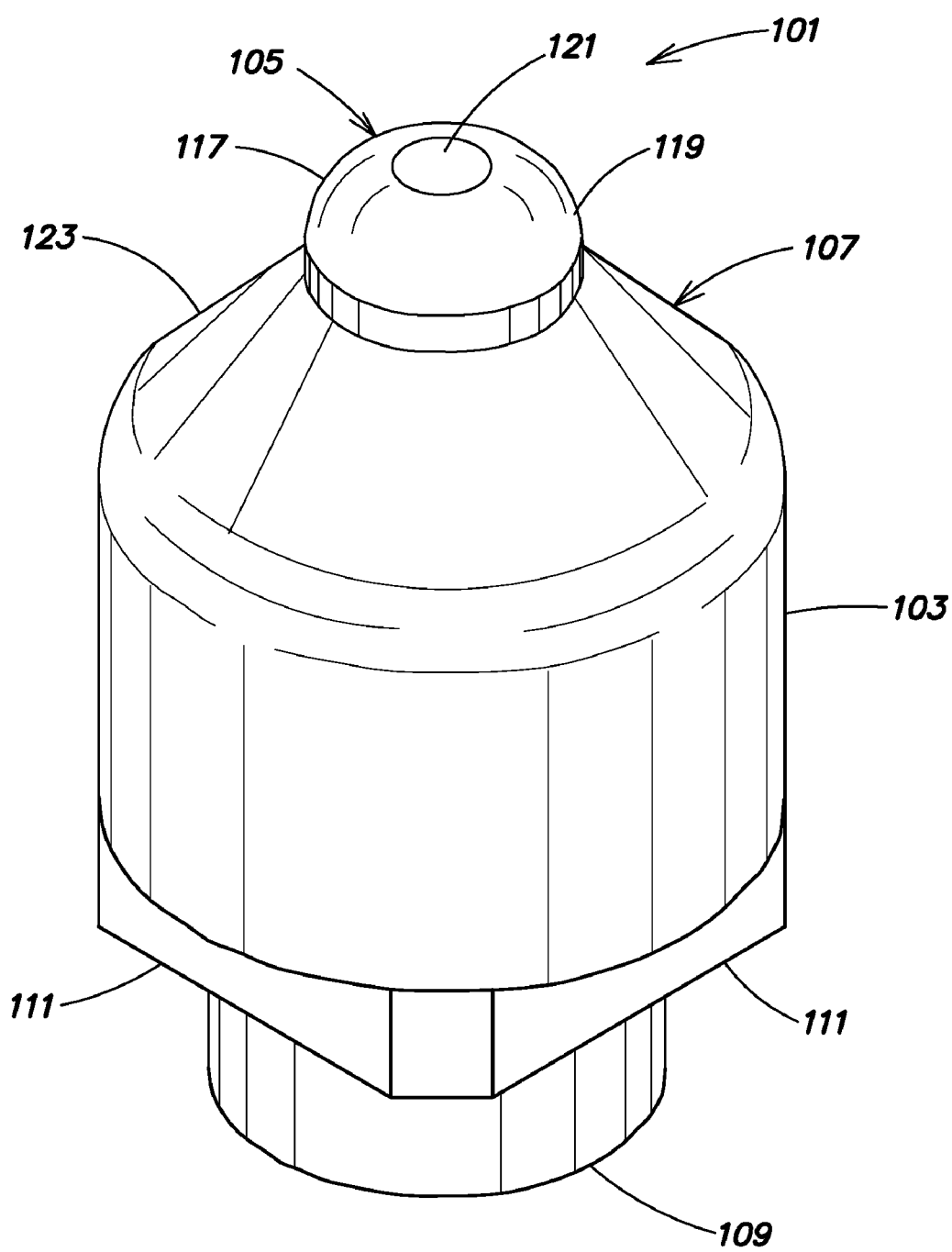
FIG. 1 is a perspective view from above a kinematic pin which is configured in accordance with the present invention.
Figure 2:
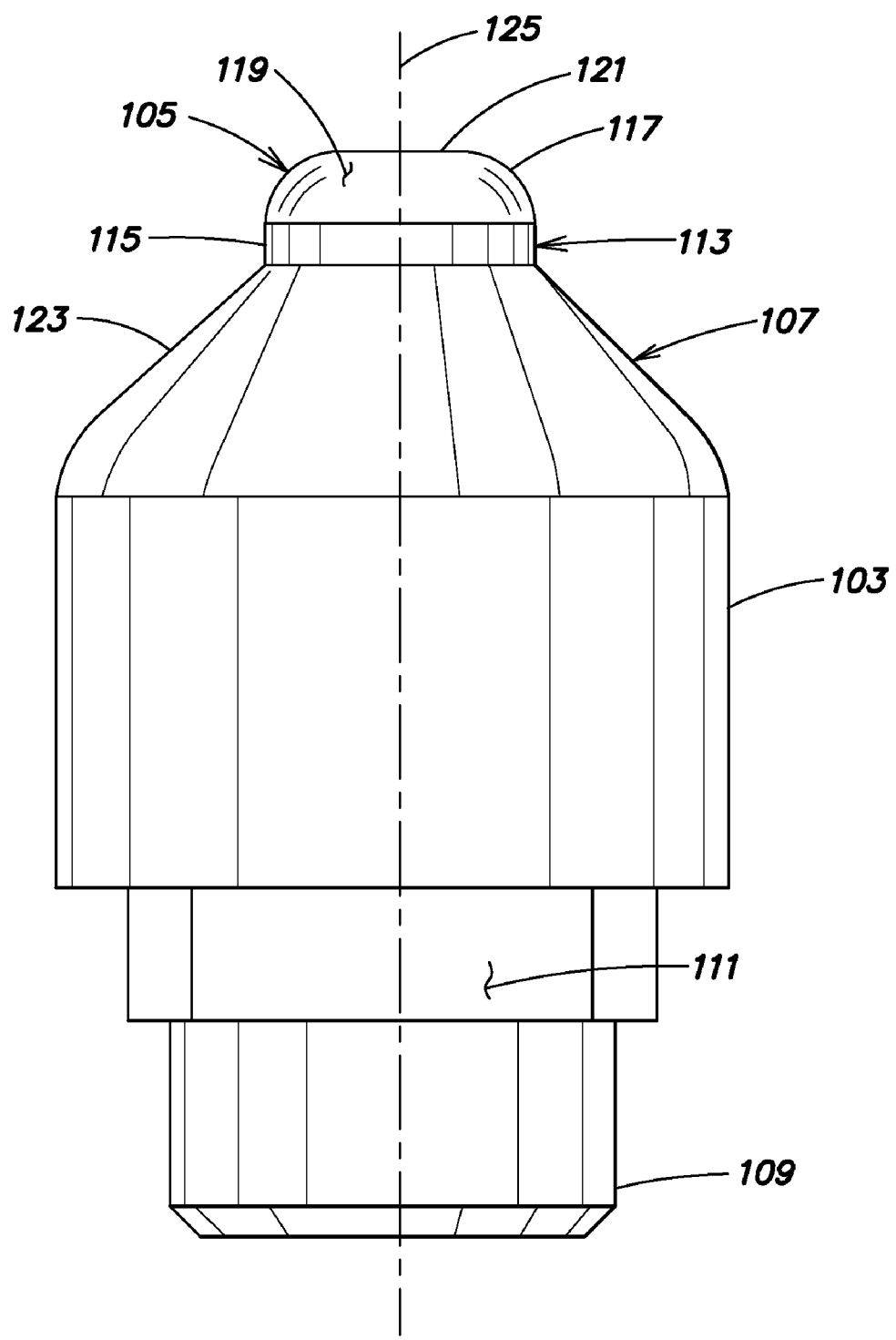
FIG. 2 is a side elevation view of the inventive kinematic pin of FIG. 1.

FIG. 1 is a perspective view from above a kinematic pin 101 which is configured in accordance with the present invention, and FIG. 2 is a side elevation view of the inventive kinematic pin 101. Referring to FIGS. 1 and 2, the kinematic pin 101 comprises a pin body 103 that includes a novel shear portion 105 as well as a substrate carrier support portion 107. As shown in FIGS. 1 and 2, pin body 103 may also include a cylindrical locating extension portion 109 to align the kinematic pin 101 with an axis of a pin mounting through-hole (not shown) in a support plate (not shown), and/or flats 111 that are adapted to interact with corresponding surfaces (not shown) of the support plate (not shown) adjacent the pin mounting hole to prevent the kinematic pin 101 from twisting once the kinematic pin 101 has been installed therein.

Referring to FIG. 2, the shear portion 105 may comprise a cylindrical portion 113 that is oriented vertically when the kinematic pin 101 is mounted on a support plate (not shown) or an end effector (not shown). The cylindrical portion 113 comprises a cylindrical surface 115 that is adapted to block lateral motion of a substrate carrier as will be explained further below. The shear portion 105 may also comprise a corner portion 117 that comprises a curved surface 119 (although a sloped, tapered or otherwise shaped surface may be employed). A top 121 of the shear portion 105 is shown to be flat in FIGS. 1 and 2, however other shapes for the top, e.g. hemispherical, are also acceptable. The substrate carrier support portion 107 comprises a frustoconically-shaped substrate carrier support surface 123, which is truncated at its apex.

Preferably, the cylindrical surface 115 of the shear portion 105 and the substrate carrier support surface 123 of the substrate carrier support portion 107 are coaxial, e.g. about common axis 125 as shown in FIG. 2. The remainder of the pin body 103 is also preferably coaxial about axis 125 as shown in FIG. 2, but an offset or an irregular shape associated with the remainder of the pin body 103 would still remain in accordance with the present invention.

Figure 3:
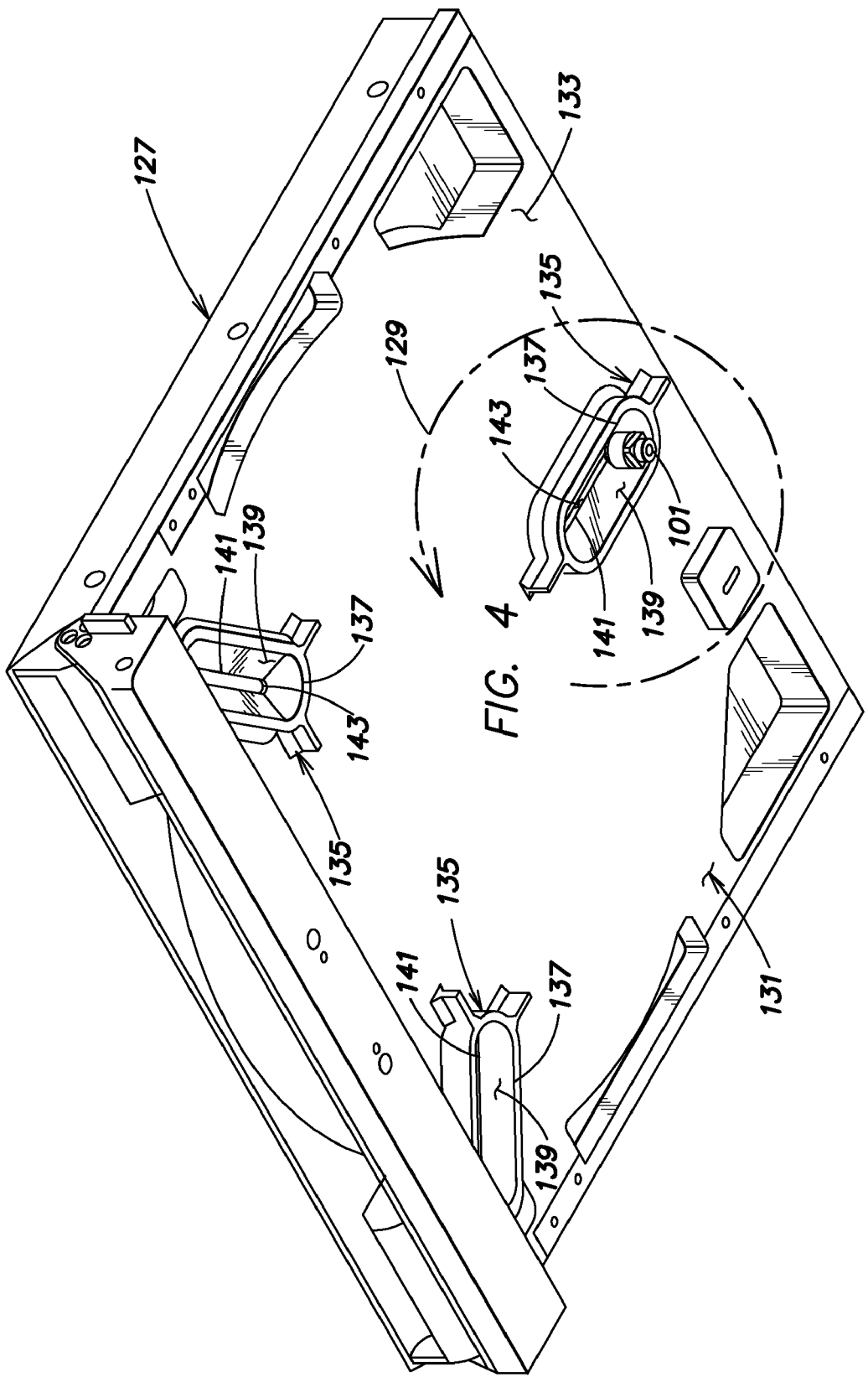
FIG. 3 is a perspective view shown from beneath an assembly including the inventive kinematic pin as well as an inventive substrate carrier.
Figure 4:
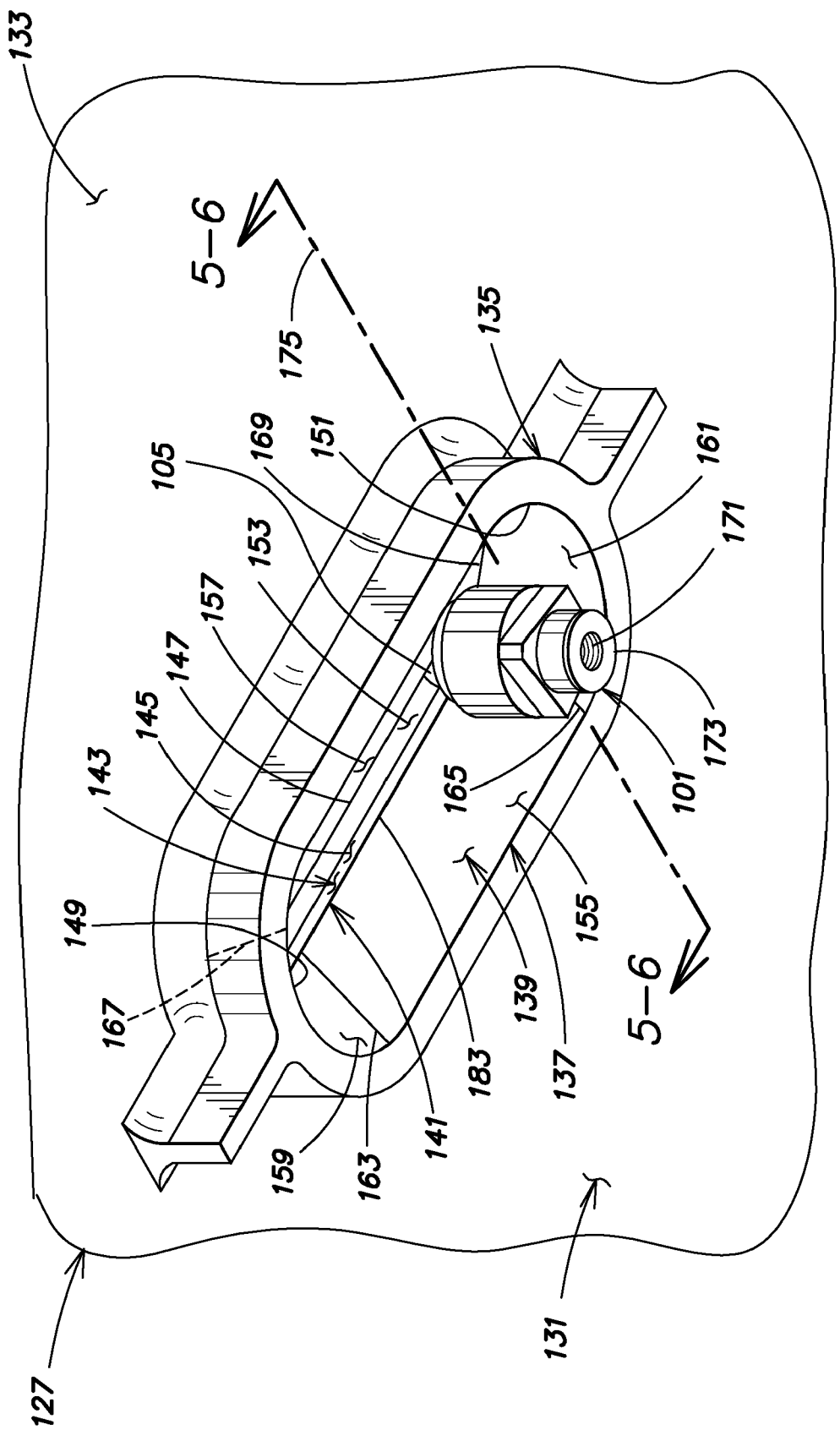
FIG. 4 is a perspective view shown from beneath the assembly of FIG. 3, and corresponding to the detail of FIG. 3.

FIG. 3 is a perspective view shown from beneath an assembly including the inventive kinematic pin 101 as well as an inventive substrate carrier 127, and FIG. 4 is also a perspective view shown from beneath the assembly of the kinematic pin 101 and the substrate carrier 127, the perspective view of FIG. 4 corresponding to the detail 129 of FIG. 3. As shown in FIG. 3, the substrate carrier 127 comprises a bottom side 131 comprising a bottom surface 133 and three kinematic pin mating features 135 located at the bottom side 119. The kinematic pin mating features 135 comprise kinematic slots 137 comprising inclined surfaces 139 and inventive shear slots 141 comprising generally vertical surfaces 143. A kinematic pin 101 of FIGS. 1 and 2 is shown to be lodged or mated within one of the kinematic pin mating features 135, the details of which will be discussed further below and with reference to FIGS. 4, 5 and 6. In operation, a kinematic pin 101 will preferably be lodged within (i.e., mated with) each of the three kinematic pin mating features 135 shown in FIG. 3 to provide stable support to the substrate carrier 127, e.g., on an end effector (not shown) to which the three kinematic pins 101 are attached.

Referring to FIG. 4, the kinematic pin mating feature 135 within which the kinematic pin 101 is lodged is shown in more detail. The shear slot 141 is defined by the vertical surface 143 which comprises a first flat vertical wall 145, a second flat vertical wall 147 (obscured, with only a lower edge showing) parallel to the first flat vertical wall 145, a first half-cylindrical vertical wall 149 (partially obscured) at a first end of the kinematic pin mating feature 135, and a second half-cylindrical vertical wall 151 (obscured by the kinematic pin 101) at a second end of the kinematic pin mating feature 135 opposite the first end. The shear slot 141 can also comprise, as is shown in FIG. 4, a flat horizontal wall 153 in communication with the vertical surface 143. However it is not necessary for the flat horizontal wall 153 to be either flat or horizontal or even that it be one continuous surface. Also, it is preferred that the shear slot 141 be deep enough that the flat horizontal wall 153 always remains clear of the top 121 of the shear portion 105 of the kinematic pin 101. The shear portion 105 of the kinematic pin 101 is shown lodged within the shear slot 141 of the kinematic pin mating feature 135 of the substrate carrier 127.

The kinematic slot 137 is defined by the inclined surface 139 which comprises a first flat inclined wall 155 adjacent the first flat vertical wall 145, a second flat inclined wall 157 adjacent the second flat vertical wall 147, a first frustoconically-shaped wall 159 adjacent the first half-cylindrical vertical wall 149, and a second frustoconically-shaped wall 161 adjacent the second half-cylindrical vertical wall 151. The first and second flat inclined walls 155, 157 meet the first and second frustoconically-shaped walls 159, 161 along a first through a fourth inclined tangent line 163, 165, 167 (obscured), and 169. The inclined surface 139 of the kinematic slot 137 of the substrate carrier 127 is adapted to achieve slidable linear communication with a similarly inclined surface of a kinematic pin, e.g., the frustoconically-shaped substrate carrier support surface 123 of the kinematic pin 101.

As shown in FIG. 4, the kinematic pin 101 additionally comprises a tapped hole 171 centered within the pin mounting portion 109 of the kinematic pin 101 (a washer 173 is also shown abutting the pin mounting portion 109). The tapped hole 171 provides a means by which a fastener (not shown) such as a screw or a bolt may fasten the kinematic pin 101 to a support plate (not shown) after the pin mounting portion 109 has been inserted into a mating through-hole (not shown) and the flats 111 have been aligned with corresponding surfaces (not shown) of the support plate (not shown). Other different fastening methods may be substituted for the one just described. For example, the pin mounting portion 109 can be equipped with high-precision peripheral threads (not shown)

and the pin mounting portion 109 can be threaded into a mating tapped hole (not shown) within a support plate (not shown).

Reference plane 175 intersects the inclined surface 139 of the substrate carrier 127 at the second inclined tangent line 165 and the third inclined tangent line 167.

Figure 5:
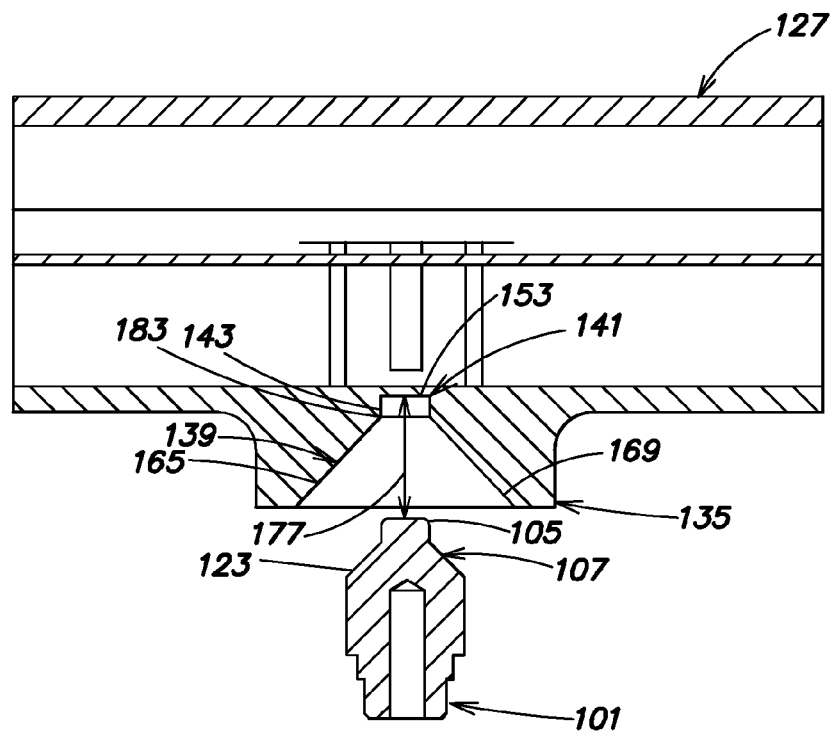
FIG. 5 is an exploded cross-sectional view of the assembly of FIGS. 3 and 4, taken along a reference plane shown in FIG. 4.
Figure 6:
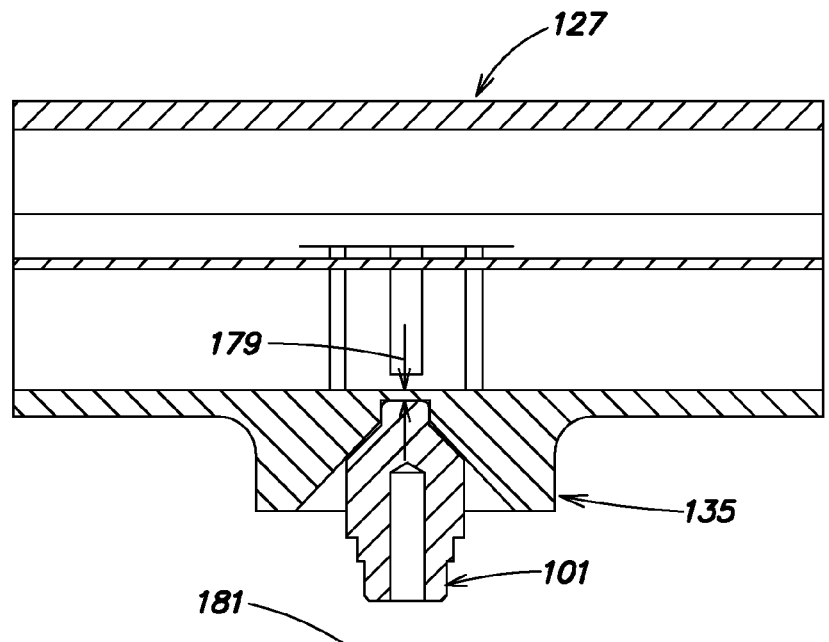
FIG. 6 is an unexploded cross-sectional view of the assembly of FIGS. 3 and 4, taken along the reference plane shown in FIG. 4.

FIG. 5 is an exploded cross-sectional view of the assembly of the inventive kinematic pin 101 and the inventive substrate carrier 127 of FIGS. 3 and 4, the cross-section being taken along reference plane 175 as it is positioned and oriented in FIG. 4 and as described above. FIG. 6 is an unexploded cross-sectional view of the inventive kinematic pin 101 and the inventive substrate carrier 127 of FIGS. 3 and 4, the cross-section being also taken along plane 175 as it is positioned and oriented in FIG. 4 and as described above.

Referring to FIGS. 5 and 6, in operation, the shear portion 105 of the kinematic pin 101 inserts into the shear slot of the substrate carrier 127. The vertical gap 177 which initially separates the kinematic pin 101 and the substrate carrier 127 as shown in FIG. 5 can be reduced to the much smaller but preferably non-zero vertical gap 179 as shown in FIG. 6, by the kinematic pin 101 rising vertically to meet the substrate carrier 127, or the substrate carrier 127 dropping vertically to meet the kinematic pin 101. The former is a scenario that is most likely a situation where three of the kinematic pins 101 are fastened to an end effector (not shown), and the end effector is being utilized to remove the substrate carrier 127 from e.g., an overhead transfer (OHT) mechanism such as an overhead conveyor. The latter is a scenario that may occur when three of the kinematic pins 101 are attached to a non-end-effector support surface (not shown) and a substrate carrier 127 is lowered by an end effector down to that support surface and placed upon the three kinematic pins 101.

Once substrate carrier support portion 107 is supporting the substrate carrier 127 via contact between the substrate carrier support surface 123 of the kinematic pin 101 and the inclined surface 139 of the substrate carrier 127 and the shear portion 105 of the kinematic pin 101 is lodged within the shear slot 141 of the substrate carrier 127, lateral motion of the kinematic pin 101 relative to the shear portion 105, e.g., motion along the lateral direction 181, i.e., normal to the direction in which the shear slot 141 extends, is deterred in a much more direct manner than would be the case if the kinematic pin 101 were not equipped with the shear portion 105, and the substrate carrier 127 were not equipped with the shear slot 141.

It is apparent that, depending upon the snugness of the fit between the shear portion 105 and the shear slot 141, if the kinematic pin 101 or the substrate carrier 127 in FIG. 6 were urged by a motive force that had a component in the lateral direction 181, the cylindrical surface 115 (FIG. 2) of the shear portion 105 will immediately come in contact with the vertical surface 143 of the substrate carrier 127. Because such contact takes place along surfaces aligned with the vertical, lateral motion between the kinematic pin 101 and the cylindrical surface 115 is essentially stopped unless and until the substrate carrier 127 is elevated relative to the kinematic pin 101 such that the vertical surface 147 of the substrate carrier 127 is vertically and laterally clear of the cylindrical surface 115 of the kinematic pin 101. Before these scenarios are further discussed with respect to the inventive kinematic pin 101 and the inventive substrate carrier 127, however, it will be profitable to discuss what such a motive force would tend to accomplish if applied in a similar way to an assembly of a kinematic pin, similar to the kinematic pin 101 but without a shear portion 105, and a substrate carrier similar to the substrate carrier 127 but without a shear slot 141.

If the kinematic pin mating feature 135 of the substrate carrier 127 of FIG. 5 were "filled-in" to form a flat surface where edge 183 (see also FIG. 4) of the shear slot 141 now appears and the shear portion 105 of the kinematic pin 101 removed to form a flat surface where the shear portion 105 previously abutted the substrate carrier support portion 107, and if the kinematic pin 101 were lodged in the kinematic pin mating feature 135, the substrate carrier support surface 123 of the kinematic pin 101 would contact the inclined surface 139 of the substrate carrier 127. These modifications having been made, it will be apparent that sliding communication between the substrate carrier support surface 123 of the kinematic pin 101 and the inclined surface 139 of the substrate carrier 127 may be initiated by a motive force aligned with the lateral direction 181, or having a force component aligned with the lateral direction 181, once static friction between the substrate carrier support surface 123 and the inclined surface 139 is overcome. Once this sliding communication starts, it is apparent that no structure on the kinematic pin 101 or the substrate carrier 127 exists to block or deter it from defeating the force of gravity, aside perhaps from roughness of the sliding surfaces sufficient to create kinetic friction.

If the motive force referenced above comprises an inertial force arising from the substrate carrier 127, e.g., due to an end effector (comprising three of the kinematic pins 101 and supporting the substrate carrier 127) subjecting the substrate carrier 127 to negative acceleration after removing the substrate carrier 127 from a moving conveyor (not shown), or due to such an end effector subjecting the substrate carrier 127 to positive acceleration in preparation for depositing the substrate carrier 127 on a moving conveyor (not shown), it is apparent that if the motive force is large enough, and is applied for a long enough period of time, it can cause the substrate carrier 127 to slide off the kinematic pin 101 completely, and to become grossly misaligned with the end effector (not shown), or even to fall off the end effector (not shown).

Given the same starting condition as in the previous paragraph (i.e., no shear portion 105 and no shear slot 141, it is also apparent that if a twisting force of sufficient magnitude were applied to the substrate carrier 127, the substrate carrier 127 would slide up and off all three of the kinematic pins 101 simultaneously.

Referring once again to FIGS. 5 and 6 illustrating the kinematic pin 101 and the substrate carrier 127 of the present invention (i.e., with the shear portion 105 and the shear slot 141 present), it is apparent that any lateral force or lateral component of a force aligned with the lateral direction 181 and tending to cause the kinematic pin 101 and substrate carrier 127 to move laterally relative to each other would be opposed by an equal and opposite force from the cylindrical surface 115 of the shear portion 105 (see FIG. 2) contacting the vertical surface 143 of the shear slot 141. It is apparent also that virtually no sliding between the substrate carrier support surface 123 and the inclined surface 139 can take place unless and until the vertical surface 139 the kinematic pin mating feature 135 is raised clear of the cylindrical surface 115 of the pin body 103. Such a gross dislodgment of the kinematic pin 101 from the kinematic pin mating feature 135 is unlikely to occur absent an unexpected and significant impact or breakage event.

The shear portion 105 may be caused to occupy the shear slot 141 via direct vertical relative motion between the kinematic pin 101 and the substrate carrier 127 as shown in FIGS. 5 and 6. Alternatively the corner portion 117 may slide along the inclined surface 139 before the shear portion 105 settles into the shear slot 141. In the latter scenario, smooth sliding is expected since the corner portion 117 preferably comprises the curved surface 119, which is rounded and thus lacks a sharp edge. After the shear portion 105 settles into the shear slot 141, non-zero clearance distance 179 will preferably exist between the top 121 (see FIG. 2) of the shear portion 105 and the flat horizontal wall 153 (see also FIG. 4) of the kinematic pin mating feature 135 ensuring that the substrate carrier support portion 107 continues to communicate with the inclined surface 139 of the kinematic pin 101 to align the substrate carrier 127 atop the kinematic pin 101.

Figure 7:
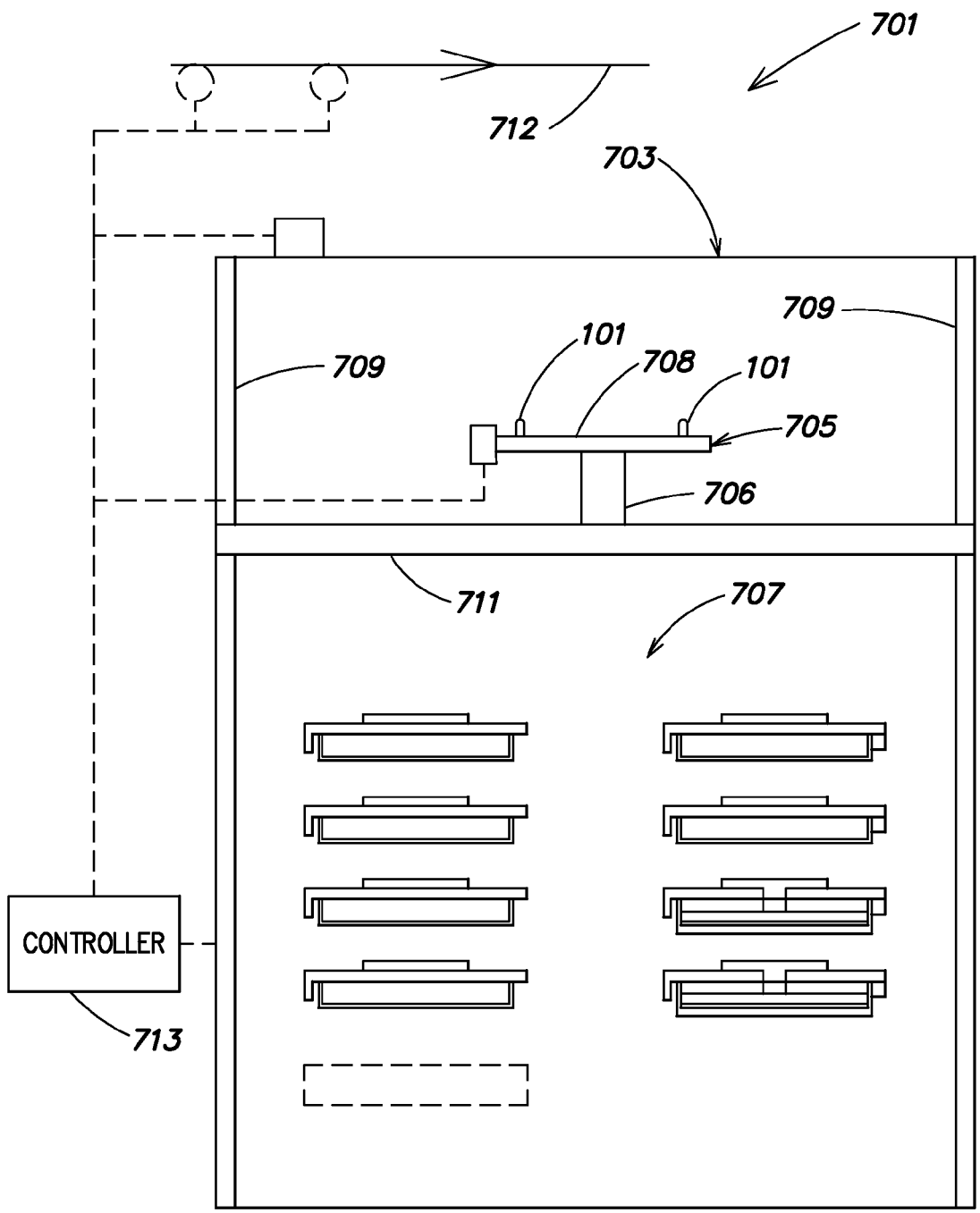
FIG. 7 is a schematic elevational view of an apparatus having a substrate carrier handler that includes the inventive kinematic pin of FIGS. 1-6.

FIG. 7 is a schematic elevational view of an apparatus 701 having a substrate carrier handler 703 that includes the inventive kinematic pin 101 of FIGS. 1-6, and is adapted to transport substrate carriers with acceleration rates that would generate lateral movement between the substrate carrier handler's end effector 705 and a substrate carrier transported thereby, absent the use of the inventive kinematic pin 101 and the inventive substrate carrier 127.

Although the apparatus 701 may be any apparatus having a substrate carrier handler adapted to accelerate a substrate carrier so as to impose a lateral inertial load on the end effector's kinematic pins, the apparatus 701 and substrate carrier handler 703 thereof, preferably is configured like the high speed system disclosed in previously incorporated U.S. patent application Ser. No. 10/650,480 filed Aug. 28, 2003, now U.S. Pat. No. 7,243,003. Specifically, the apparatus 701 preferably includes a plurality of docking stations 707 at which substrate carriers (preferably those adapted to transport only a single substrate at a time) are opened and substrate(s) loaded and unloaded thereto/from.

The substrate carrier handler 703 preferably comprises vertical supports 709 and a horizontal support 711 coupled to the vertical supports 709 for vertical movement therealong. The end effector 705 is mounted on the support 706. The end effector 705 may be, for example, in the form of a horizontally-oriented platform 708 adapted to support a substrate carrier 127. In at least one embodiment, the platform 708 may have the kinematic pins 101. (Although only two kinematic pins 101 are shown in FIG. 7, other numbers of kinematic pins or features such as three or more may be provided on the platform 708.) The kinematic pins 101 may cooperate with kinematic pin mating features 135 (FIG. 5) on the bottom of the substrate carrier 127 to guide the substrate carrier 127 into correct (positive) positioning on the platform 708. The end effector 705 is coupled to move horizontally along the horizontal support 711, and a controller 713 controls the apparatus 701 such that the end effector 705 may accelerate, and match velocity with a substrate carrier or substrate carrier support being transported by a moving overhead transport system 712 so as to hand off substrate carriers therebetween (with minimal impact on the substrate carrier). The substrate carrier handler 703 then decelerates and transports the substrate carrier to one of the docking stations 707. As the apparatus 701 is configured for such a moving handoff, inertial loads may cause substrate carriers to dislodge from the end effector's kinematic pins, absent the use of the inventive shear pin and substrate carrier described above with reference to FIGS. 1-6.

The foregoing description discloses only a preferred embodiment of the invention; modifications of the above disclosed apparatus which fall within the scope of the invention will be readily apparent to those of ordinary skill in the art. For instance, the inventive kinematic pin may be employed on other types of substrate carrier handlers than that shown and described with reference to FIG. 7. It also may be advantageous to employ the inventive kinematic pin on a storage shelf or a loadport at which a substrate carrier may be supported.

The specific shape of the pin body, shear member, and shear slot may vary. In fact, the substrate carriers mating feature need not consist of a slot, but instead could be a circular or elliptical indentation, etc. Further, the mating feature may comprise a downward protrusion that mates with a corresponding aperture, indentation or depressed shear member of the kinematic pin.

Instead of the single shear member a plurality of shear members may be located on a single kinematic pin.

While the present invention has been described primarily with reference to wafers, it will be understood that the invention also may be employed with other substrates such as a mask, a reticule, a silicon substrate, a glass plate, etc., whether patterned or unpatterned; and/or with apparatus for transporting and/or processing such substrates.

Accordingly, while the present invention has been disclosed in connection with exemplary embodiments thereof, it should be understood that other embodiments may fall within the spirit and scope of the invention, as defined by the following claims.

The invention claimed is:

1. A substrate carrier handler comprising:
 an end effector adapted to support a substrate carrier;
 one or more kinematic pins located on the end effector for supporting a substrate carrier, the one or more kinematic pins having:
  an inclined surface for aligning the substrate carrier; and
  a shear member extending from the inclined surface for deterring lateral movement of the substrate carrier relative to the one or more kinematic pins and adapted to mate with a feature of the substrate carrier; and
 a controller adapted to cause the substrate carrier handler to accelerate the end effector so as to generate a lateral inertial load between the one or more kinematic pins, and a substrate carrier supported thereon, the controller further adapted to allow the end effector to deposit the substrate carrier on a surface.

2. The substrate carrier handler of claim 1 wherein the shear member extends upwardly from the inclined surface.

3. The substrate carrier handler of claim 1 wherein the controller is further adapted to move the end effector having the substrate carrier supported thereon between at least a first and a second location.

4. The substrate carrier handler of claim 3 wherein the first location is an overhead transport system.

5. The substrate carrier handler of claim 3 wherein the second location is a docking station.

6. The substrate carrier handler of claim 1 wherein the end effector is adapted to move in a horizontal direction and a vertical direction.

7. The substrate carrier handler of claim 1 wherein the controller is further adapted to match a velocity of the substrate carrier with a velocity of a moving transport system.

8. The substrate carrier handler of claim 7 wherein the substrate carrier handler is adapted to hand off a substrate carrier between the end effector and the moving transport system.

9. The substrate carrier handler of claim 1 wherein the shear member includes a cylindrical portion for mating with the feature.

10. The substrate carrier handler of claim 9 wherein the inclined surface further comprises an upward-tapering frustoconical surface.

11. The substrate carrier handler of claim 10 wherein the shear member further comprises a hemispherical end distal the frustoconical surface and abutting the cylindrical portion.

12. The substrate carrier handler of claim 1 wherein the one or more kinematic pins further includes a cylindrical locating extension adapted to allow the pin to be fastened to the end effector.

13. The substrate carrier handler of claim 12 wherein the one or more kinematic pins further comprises a tapped hole on an end of the cylindrical locating extension to allow the one or more kinematic pins to be fastened to the end effector.

14. The substrate carrier handler of claim 12 wherein the one or more kinematic pins further comprises threads on at least a portion of the cylindrical locating extension to allow the one or more kinematic pins to be fastened to the end effector.

15. The substrate carrier handler of claim 1 wherein the one or more kinematic pins further comprises a cylindrical surface extending from a lower end of the inclined surface.

16. The substrate carrier handler of claim 15 further comprising at least one flat extending from the cylindrical surface, the at least one flat adapted to interact with a corresponding surface of the end effector.

17. The substrate carrier handler of claim 16 wherein the one or more kinematic pins further comprises a cylindrical locating extension which extends from the at least one flat and is adapted to allow the one or more kinematic pins to be fastened to the end effector.

18. The substrate carrier handler of claim 17 wherein the one or more kinematic pins further comprises a tapped hole on an end of the cylindrical locating extension to allow the one or more kinematic pins to be fastened to the end effector.

19. A substrate carrier handler comprising:
an end effector adapted to support a substrate carrier;
one or more kinematic pins located on the end effector for supporting a substrate carrier, the one or more kinematic pins having:
an inclined surface for aligning the substrate carrier, the inclined surface adapted to slidably communicate with an inclined surface of a mating feature of the substrate carrier; and
a shear member extending from the inclined surface adapted to deter lateral movement of the substrate carrier relative to the one or more kinematic pins and adapted to mate with a feature of the substrate carrier, the shear member including a cylindrical portion for mating with the feature; and
a controller adapted to cause the substrate carrier handler to accelerate the end effector so as to generate a lateral inertial load between the one or more kinematic pins, and a substrate carrier supported thereon, the controller further adapted to allow the end effector to deposit the substrate carrier on a surface.

20. A substrate carrier handler comprising:
an end effector adapted to support a substrate carrier;
one or more kinematic pins located on the end effector for supporting the substrate carrier, the one or more kinematic pins comprising:
an inclined surface for aligning the substrate carrier, the inclined surface adapted to slidably communicate with an inclined surface of a mating feature of the substrate carrier, the inclined surface comprising an upward-tapering frustoconical surface; and
a shear member extending from the inclined surface for deterring lateral movement of the substrate carrier relative to the one or more kinematic pins and adapted to mate with a feature of the substrate carrier, the shear member including a cylindrical portion protruding from the frustoconical surface for mating with the feature, the cylindrical portion and upward-tapering frustoconical surface of the inclined surface being symmetrically aligned about a common vertical axis, the shear member further having a hemispherical end distal the frustoconical surface and abutting the cylindrical portion;
a cylindrical surface extending from a lower end of the inclined surface;
at least one flat extending from the cylindrical surface and adapted to interact with a corresponding surface of the end effector;
a cylindrical locating extension extending from the at least one flat and adapted to allow the pin to be fastened to the end effector; and
a controller adapted to cause the substrate carrier handler to accelerate the end effector so as to generate a lateral inertial load between the one or more kinematic pins, and a substrate carrier supported thereon, the controller further adapted to allow the end effector to deposit the substrate carrier on a surface.

* * * * *